United States Patent [19]

Misaizu

[11] 4,264,829
[45] Apr. 28, 1981

[54] MOS INVERTER-BUFFER CIRCUIT HAVING A SMALL INPUT CAPACITANCE

[76] Inventor: Tetsuo Misaizu, c/o Nippon Electric Co., Ltd., 33-1, Shiba Gochome, Minato-ku, Tokyo, Japan

[21] Appl. No.: 39,850

[22] Filed: May 17, 1979

[30] Foreign Application Priority Data

May 22, 1978 [JP] Japan .................................. 53-61491

[51] Int. Cl.³ ................. H03K 19/017; H03K 19/094; H03K 19/20
[52] U.S. Cl. ..................................... 307/450; 307/475
[58] Field of Search ............... 307/205, 214, 270, 264, 307/DIG. 1, DIG. 5; 365/189, 230

[56] References Cited

U.S. PATENT DOCUMENTS

| | | | |
|---|---|---|---|
| 3,649,843 | 3/1972 | Redwine et al. | 307/214 |
| 3,806,738 | 4/1974 | Chin et al. | 307/DIG. 4 X |
| 3,937,983 | 2/1976 | Reed | 307/270 X |
| 4,042,839 | 8/1977 | Araki | 307/270 |
| 4,071,783 | 1/1978 | Knepper | 307/205 X |
| 4,096,398 | 6/1978 | Khaitan | 307/DIG. 1 X |
| 4,101,788 | 7/1978 | Baker | 307/DIG. 1 X |
| 4,103,189 | 7/1978 | Perlegos et al. | 307/270 |
| 4,133,611 | 1/1979 | Baker | 307/DIG. 1 X |

OTHER PUBLICATIONS

Knepper, "Enhancement/Depletion Mode Field-Effect Transistor Driver", *IBM Tech. Discl. Bull.*, vol. 19, No. 3, pp. 922-923; 8/19/76.
Delahanty et al., "Depletion-Mode FET Load Devices Switched With Positive Signal Voltage Levels", *IBM Tech. Discl. Bull.*, vol. 19, No. 7, pp. 2612, 12/76.
Chu et al., "Bootstrap Push-Pull Driver", *IBM Tech. Discl. Bull.*, vol. 18, No. 3, pp. 710-711, 8/1975.
Love, "In-Phase Weak-Signal Input Circuit", *IBM Tech. Discl. Bull.*, vol. 19, No. 12, pp. 4673, 5/1977.

*Primary Examiner*—Larry N. Anagnos

[57] ABSTRACT

For preventing an input signal supplied to an input terminal (A) from directly affecting an inverted signal derived at a node (15), an inverter stage of an inverter-buffer circuit composed of MOS transistors comprises two additional partial inverter stages ($Q_6$-$Q_5$ and $Q_7$-$Q_8$) between a buffer stage ($Q_3$-$Q_4$) and a conventional inverter stage ($Q_1$-$Q_2$) that serves now as an input-side partial inverter stage. The buffer stage favorably comprises an additional MOS transistor ($Q_9$) having a gate connected directly to the node in order to achieve a short switching delay.

3 Claims, 5 Drawing Figures

MOS INVERTER-BUFFER CIRCUIT HAVING A SMALL INPUT CAPACITANCE

BACKGROUND OF THE INVENTION:

This invention relates to an inverter-buffer circuit composed of a certain number of metal-oxide(insulator)-semiconductor field-effect transistors (herein abbreviated to MOS transistors), each having an insulated-gate. This invention is specifically adapted to an inverter-buffer circuit, comprised by an MOS integrated circuit, for converting a TTL (transistor-transistor logic) input signal to an output signal of the MOS level.

As will be described later with reference to a few of several figures of the accompanying drawing, an inverter-buffer circuit of the type described is already known. A known circuit, however, is still defective in that the output signal is adversely affected directly by the input signal and that the input capacitance is considerably large.

SUMMARY OF THE INVENTION:

It is therefore an object of the present invention to provide an inverter-buffer circuit composed of a plurality of insulated-gate MOS transistors, capable of producing an output signal that is little adversely affected directly by an input signal.

It is another object of this invention to provide an inverter-buffer circuit of the type described, which has a small input capacitance.

An inverter-buffer circuit to which this invention is applicable comprises an inverter stage between a signal input terminal and a first and a second intermediate terminal and between a power supply terminal and a point of a common potential and a buffer stage between the intermediate terminals and a signal output terminal and between the power supply terminal and the common potential point. The inverter stage includes a first MOS transistor of the enhancement type having a gate connected to the input terminal and operatively coupled to the first intermediate terminal, a source connected to the common potential point, and a drain connected to a node operatively coupled, in turn, to the second intermediate terminal and a second MOS transistor of the depletion type having a gate connected to the node, a source connected also to the node, and a drain connected to the power supply terminal. The buffer stage comprises a third MOS transistor of the enhancement type having a gate connected to the first intermediate terminal, a source connected to the common potential point, and a drain connected to the output terminal and a fourth MOS transistor of the enhancement type having a gate connected to the second intermediate terminal, a source connected to the output terminal, and a drain connected to the power supply terminal. According to this invention, the inverter stage comprises a fifth MOS transistor of the depletion type having a gate connected to the input terminal, a source connected to the first intermediate terminal, and a drain connected to the power supply terminal, a sixth MOS transistor of the enhancement type having a gate connected to the node, a source connected to the common potential point, and a drain connected to the first intermediate terminal, a seventh MOS transistor of the enhancement type having a gate connected to the first intermediate terminal, a source connected to the common potential point, and a drain connected to the second intermediate terminal, and an eighth MOS transistor of the depletion type having an insulated gate connected to the node, a source connected to the second intermediate terminal, and a drain connected to the power supply terminal.

Figure 1:
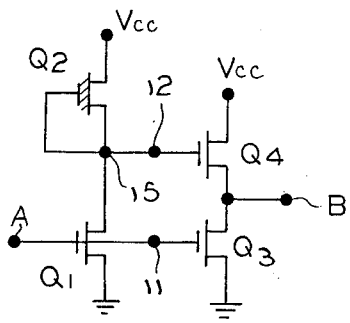
FIG. 1 illustrates a conventional inverter-buffer circuit composed of a certain number of MOS transistors.

DESCRIPTION OF THE PREFERRED EMBODIMENTS:

Referring to FIG. 1, a conventional inverter-buffer circuit will be described at first in order to facilitate an understanding of the present invention. The inverter-buffer circuit comprises an inverter stage between a signal input terminal A and first and second intermediate terminals 11 and 12 and between a power supply terminal $V_{cc}$ and a point of a common potential depicted as ground. A buffer stage of the circuit is connected between the intermediate terminals 11 and 12 and a signal output terminal B and between the power supply terminal $V_{cc}$ and the common potential point. The inverter stage comprises a first MOS transistor $Q_1$ of the enhancement type having a gate connected to the input terminal A and to the first intermediate terminal 11, a source connected to the common potential point, and a drain connected to a node 15 that serves as a stage output terminal for an inverted signal and is connected, in turn, to the second intermediate terminal 12. The inverter stage further comprises a second MOS transistor $Q_2$ of the depletion type having a gate connected to the node 15, a source connected also to the node 15, and a drain connected to the power supply terminal $V_{cc}$. The buffer stage comprises a third MOS transistor $Q_3$ of the enhancement type having a gate connected to the first intermediate terminal 11, a source connected to the common potential point, and a drain connected to the output terminal B and a fourth MOS transistor $Q_4$ of the enhancement type having a gate connected to the second intermediate terminal 12, a source connected to the output terminal B, and a drain connected to the power supply terminal $V_{cc}$.

Figure 2:
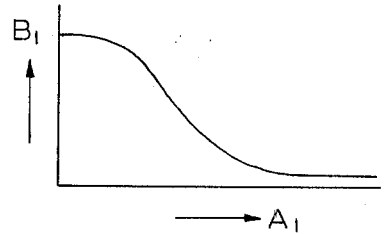
FIG. 2 schematically shows an input-output characteristic of the conventional inverter-buffer circuit.

In the circuit exemplified in FIG. 1, it is known that the first MOS transistor $Q_1$ should have much greater width-to-length ratio than the second MOS transistor $Q_2$ as discussed in, for example, U.S. Pat. No. 3,649,843 by Donald J. Redwine et al. This is in order to keep the node 15 at a low potential when the input terminal A is supplied with an input signal $A_1$ of a high level. The input signal $A_1$ is liable to directly adversely affect an output signal $B_1$ delivered to the output terminal B as exemplified in FIG. 2. More specifically, the output signal $B_1$ is not kept at a sufficiently high level when the lower level of the input signal $A_1$ is higher than the threshold level of the first MOS transistor $Q_1$. Inasmuch as the first MOS transistor $Q_1$ has a wide area, the input signal $A_1$ suffers from a large input capacitance due to transistors $Q_1 Q_3$ although the width-to length ratios of the third and the fourth MOS transistors $Q_3$ and $Q_4$ are immaterial.

Figure 3:
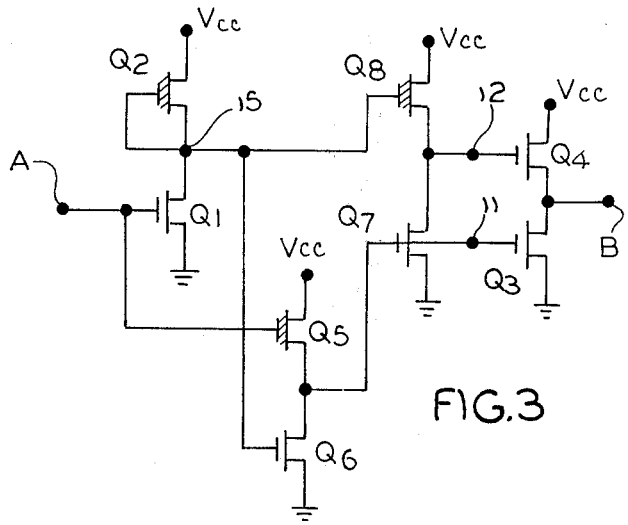
FIG. 3 illustrates an inverter-buffer circuit according to a first embodiment of the instant invention.

Referring now to FIG. 3, an inverter-buffer circuit according to a first embodiment of this invention comprises similar parts designated by like reference numerals as in FIG. 1. The gate of the first MOS transistor $Q_1$ and the node 15 are not directly connected to the first and the second intermediate terminals 11 and 12, respectively. The inverter stage comprises a fifth MOS transistor $Q_5$ of the depletion type having a gate connected to the input terminal A, a source connected to the first intermediate terminal 11, and a drain connected to the power supply terminal $V_{cc}$. A sixth MOS transistor $Q_6$ of the enhancement type has a gate connected to the node 15, a source connected to the common potential point, and a drain connected to the first intermediate terminal 11. A seventh MOS transistor $Q_7$ of the enhancement type has a gate connected to the first intermediate terminal 11, a source connected to the common potential point, and a drain connected to the second intermediate terminal 12. An eighth MOS transistor $Q_8$ of the depletion type has a gate connected to the node 15, a source connected to the second intermediate terminal 12, and a drain connected to the power supply terminal $V_{cc}$.

In the circuit depicted in FIG. 3, each pair of the first and the second MOS transistors $Q_1$ and $Q_2$, the sixth and the fifth MOS transistors $Q_6$ and $Q_5$, or the seventh and the eighth MOS transistors $Q_7$ and $Q_8$ cooperates with each other to form a partial inverter stage. It is therefore necessary that the first, the sixth, and the seventh MOS transistors $Q_1$, $Q_6$, and $Q_7$ should have greater width-to-length ratios than the cooperating MOS transistors $Q_2$, $Q_5$, and $Q_8$, respectively, although the width-to-length ratios of the third and the fourth MOS transistors $Q_3$ and $Q_4$ are not critical. An output signal B' delivered to the output terminal B is little adversely affected directly by the input signal $A_1$ supplied to the input terminal A because two additional partial inverter stages $Q_6$-$Q_5$ and $Q_7$-$Q_8$ are interposed between the buffer stage $Q_3$-$Q_4$ and a conventional inverter stage $Q_1$-$Q_2$ that serves now as an input-side partial inverter stage. Inasmuch as the input signal $A_1$ is supplied to the first and the fifth MOS transistors $Q_1$ and $Q_5$, of which the latter transistor $Q_5$ can be made to have a very narrow area smaller than that of transistor $Q_3$, it is possible to markedly reduce the input capacitance. It is, however, inevitable that the illustrated inverter-buffer circuit has a switching delay somewhat longer than a conventional inverter-buffer circuit because of the two interposed partial inverter stages $Q_6$-$Q_5$ and $Q_7$-$Q_8$ through which the inverted signal is eventually supplied to the buffer stage $Q_3$-$Q_4$.

Figure 4:
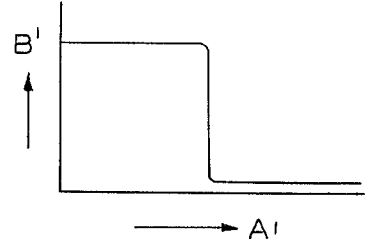
FIG. 4 diagrammatically shows an input-output characteristic of the circuit depicted in FIG. 3.

Turning to FIG. 4, an input-output characteristic of the circuit illustrated in FIG. 3 is quite excellent. More particularly, the output signal B' has a sufficiently high level even when the lower level of the input signal $A_1$ is higher than the threshold level of the first MOS transistor $Q_1$.

Figure 5:
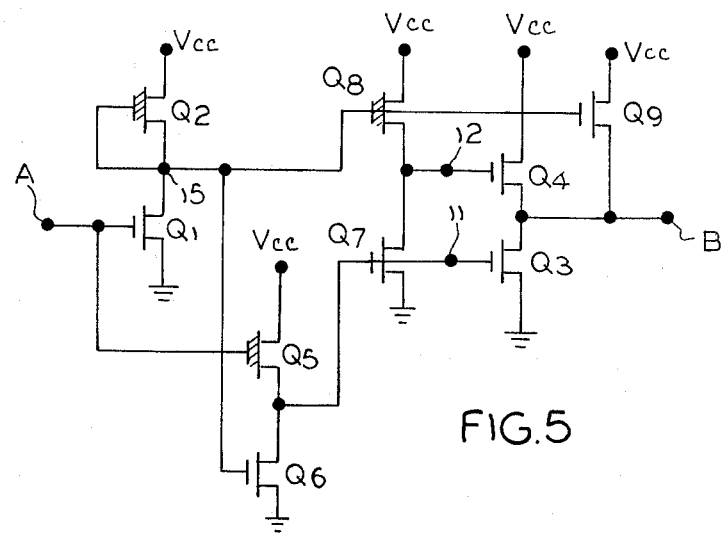
FIG. 5 shows an inverter-buffer circuit according to a second embodiment of this invention.

Finally referring to FIG. 5, an inverter-buffer circuit according to a second embodiment of this invention comprises similar parts designated by like reference symbols as in FIG. 3. The buffer stage of this circuit comprises a ninth MOS transistor $Q_9$ of the enhancement type having a gate connected directly to the node 15, a source connected to the output terminal B, and a drain connected to the power supply terminal $V_{cc}$ in addition to the third and the fourth MOS transistors $Q_3$ and $Q_4$. The ninth MOS transistor $Q_9$ need not have a great width-to-length ratio.

The circuit shown in FIG. 5 has the features described with reference to FIGS. 3 and 4. Furthermore, the illustrated circuit has as small a switching delay as the conventional inverter-buffer circuit because the ninth MOS transistor $Q_9$ is supplied with the inverted signal directly from the input-side partial inverter stage comprising the first and the second MOS transistors $Q_1$ and $Q_2$.

While a few embodiments of this invention have thus far been described, it is now possible for those skilled in the art to carry this invention into effect readily in various other ways. For instance, an inverter-buffer circuit according to this invention can be composed of P-channel MOS transistors rather than of N-channel MOS transistors.

What is claimed is:

1. In a circuit comprising an inverter stage between a signal input terminal and a first and a second intermediate terminal and between a power supply terminal and a point of a common potential and a buffer stage between said intermediate terminals and a signal output terminal and between said power supply terminal and said common potential point, said inverter stage including a first insulated-gate field-effect transistor of the enhancement type having a gate connected to said input terminal and operatively coupled to said first intermediate terminal, a source connected to said common potential point, and a drain connected to a node operatively coupled, in turn, to said second intermediate terminal and a second insulated-gate field-effect transistor of the depletion type having a gate connected to said node, a source connected also to said node, and a drain connected to said power supply terminal, said buffer stage comprising a third insulated-gate field-effect transistor of the enhancement type having a gate connected to said first intermediate terminal, a source connected to said common potential point, and a drain connected to said output terminal and a fourth insulated-gate field-effect transistor of the enhancement type having a gate connected to said second intermediate terminal, a source connected to said output terminal, and a drain connected to said power supply terminal, the improvement wherein said inverter stage comprises a fifth insulated-gate field-effect transistor of the depletion type having a gate connected to said input terminal, a source connected to said first intermediate terminal, and a drain connected to said power supply terminal, a sixth insulated-gate field-effect transistor of the enhancement type having a gate connected to said node, a source connected to said common potential point, and a drain connected to said first intermediate terminal, a seventh insulated-gate field-effect transistor of the enhancement type having a gate connected to said first intermediate terminal, a source connected to said common potential point, and a drain connected to said second intermediate terminal, and an eighth insulated-gate field-effect transistor of the depletion type having a gate connected to said node, a source connected to said second intermediate terminal, and a drain connected to said power supply terminal.

2. The circuit as claimed in claim 1, wherein said buffer stage further comprises a ninth insulated-gate field-effect transistor of the enhancement type having a gate connected to said node, a source connected to said output terminal, and a drain connected to said power supply terminal.

3. The circuit as claimed in claim 1 or 2, wherein the size of said fifth transistor is smaller than that of said third transistor.

* * * * *

UNITED STATES PATENT AND TRADEMARK OFFICE
CERTIFICATE OF CORRECTION

PATENT NO. : 4,264,829

DATED : April 28, 1981

INVENTOR(S) : Tetsuo Misaizu

It is certified that error appears in the above—identified patent and that said Letters Patent is hereby corrected as shown below:

On the title page, add Item /73/ to read:

--- Nippon Electric Company, Ltd. Tokyo, Japan ---.

Signed and Sealed this

First Day of September 1981

[SEAL]

Attest:

GERALD J. MOSSINGHOFF

Attesting Officer

Commissioner of Patents and Trademarks